United States Patent
Kang

(10) Patent No.: US 6,549,448 B2
(45) Date of Patent: Apr. 15, 2003

(54) FERAM HAVING ADJACENT MEMORY CELLS SHARING CELL PLATE AND DRIVING METHOD FOR THE SAME

(75) Inventor: Young-Min Kang, Ichon-shi (KR)

(73) Assignee: Hynix Semiconductor Inc., Ichon-shi (KR)

(*) Notice: Subject to any disclaimer, the term of this patent is extended or adjusted under 35 U.S.C. 154(b) by 0 days.

(21) Appl. No.: 09/949,080

(22) Filed: Sep. 10, 2001

(65) Prior Publication Data

US 2002/0141223 A1 Oct. 3, 2002

(30) Foreign Application Priority Data

Mar. 28, 2001 (KR) .......................................... 2001-16151

(51) Int. Cl.[7] .............................................. G11C 11/22
(52) U.S. Cl. .......................... 365/145; 365/65; 365/149
(58) Field of Search ................................ 365/145, 117, 365/65, 149

(56) References Cited

U.S. PATENT DOCUMENTS

| | | | |
|---|---|---|---|
| 5,539,279 A | | 7/1996 | Takeuchi et al. |
| 5,959,878 A | * | 9/1999 | Kamp .......................... 365/117 |
| 6,028,784 A | | 2/2000 | Mori et al. |
| 6,038,162 A | * | 3/2000 | Takata et al. ............... 365/145 |
| 6,137,711 A | | 10/2000 | Tan |
| 6,147,895 A | * | 11/2000 | Kamp .......................... 365/145 |

FOREIGN PATENT DOCUMENTS

| | | | |
|---|---|---|---|
| JP | 11-103024 | 4/1999 | .......... H01L/27/10 |
| JP | 11-274406 | 8/1999 | .......... H01L/27/04 |
| JP | 2000-187989 | 7/2000 | .......... G11C/14/00 |
| JP | 2000-040376 | 8/2000 | .......... G11C/14/00 |

* cited by examiner

Primary Examiner—David Nelms
Assistant Examiner—Gene N. Auduong
(74) Attorney, Agent, or Firm—Jacobson Holman PLLC

(57) ABSTRACT

A FeRAM device includes a first memory cell and a second memory cell sharing a cell plate, in which the first memory cell and the second memory cell are commonly coupled to a bit line. The first memory cell is driven by a first word line and the second memory cell is driven by a second word line. The first memory cell includes a ferroelectric capacitor having a first electrode connected to the cell plate, a second electrode, and a ferroelectric layer disposed between the first electrode and the second electrode; a first transistor having a gate electrode connected to the first word line, a source and a drain, wherein the source and the drain of the first transistor are respectively connected to the bit line and the second electrode of the ferroelectric capacitor; and a second transistor having a gate electrode connected to the second word line, a source and a drain, wherein the source and the drain of the second transistor are respectively connected to the second electrode of the ferroelectric capacitor and the cell plate.

9 Claims, 11 Drawing Sheets

WL0      CP0_1      WL1

WL0    DWL1    CP0_1    DWL0    WL1

FERAM HAVING ADJACENT MEMORY CELLS SHARING CELL PLATE AND DRIVING METHOD FOR THE SAME

FIELD OF THE INVENTION

The present invention relates to a ferroelectric random access memory (FeRAM) and, more particularly, to a FeRAM having adjacent memory cells sharing cell plate and a driving method for the same.

DESCRIPTION OF THE PRIOR ART

A ferroelectric random access memory (FeRAM) is a nonvolatile semiconductor memory device with a highly integrated dynamic random access memory (DRAM), the speedy information processing of a static random access memory (SRAM), and the information storing function of a flash memory. As compared with a conventional flash memory and an electrically erasable programmable read only memory (EEPROM), the FeRAM has a relatively low operational voltage and an operating speed that is about 1000 times faster.

When voltage is applied to a DRAM capacitor, which includes a dielectric layer such as a $SiO_2$ layer or a SiON layer, and then the voltage supply is terminated, the charges in the DRAM capacitor are discharged so that data stored in the DRAM are lost.

The ferroelectric material has two stabilized remnant polarization states at room temperature. Unlike the DRAM capacitor, the ferroelectric capacitor in the FeRAM maintains previously stored data by the remnant polarization of a ferroelectric material even if the power supply is terminated.

FIG. 1 is a graph showing a hysteresis loop of a ferroelectric capacitor. In FIG. 1, positive voltage is defined when the potential of a plate line is higher than that of a bit line and the remnant polarizations at points "a" and "c", are defined to data "1" and "0", respectively.

If the transistor is turned on and a negative voltage is applied to the plate line "PL", then a negative voltage is also applied to the ferroelectric capacitor and a charge variation passes through point "d" in the hysteresis loop. After that, in case of turning the applied voltage to "0 V", a polarization value goes to point "a" and the data "1" is stored. Meanwhile, when the data "0" is inputted, a positive voltage is applied to the ferroelectric capacitor and the charge variation passes through point "b" and, turning the applied voltage to "0 V", then a polarization value goes to point "c" and the data "0" is stored.

When the voltage is applied to the ferroelectric capacitor, data are written by detecting the voltage variation on the bit line. That is, if positive voltage is applied to the capacitor, in case the data is "0", the charge variation of $\Delta Q_0$ is detected. That is, the charge variation on the bit line is determined by information stored on the capacitor. The charge variation due to the remnant polarization of the ferroelectric capacitor changes a voltage level on the bit line. Typically, parasite capacitance "$C_{BL}$" exists on the bit line itself. When the transistor is turned on and a memory to be read out is selected, charges of as much as $\Delta Q_1$ or $\Delta Q_0$ are outputted. Bit line voltages "$V_{BL1}$" and "$V_{BL0}$" are acquired by dividing the $\Delta Q_1$ and the $\Delta Q_0$ with the sum of bit line capacitance "$C_{BL}$" and ferroelectric capacitor capacitance "Cs" and is given by:

$$V_{BL1} = \Delta Q_{BL1}/(C_{BL}+Cs)$$

$$V_{BL0} = \Delta Q_{BL0}/(C_{BL}+Cs)$$

Therefore, the potential on the bit line is varied according to the difference between the data "1" and "0". When the transistor is turned on by applying voltage to the word line, potential on the bit line is changed to the "$V_{BL1}$" or the "$V_{BL0}$". In order to determine whether the potential on the bit line is in a voltage level of "$V_{BL1}$" or "$V_{BL0}$", a reference voltage "$V_{ref}$", which is set to a specific voltage level between the voltage levels "$V_{BL1}$" and "$V_{BL0}$", is used.

$SrBi_2Ta_2O_9$ (hereinafter, referred to as an SBT) or $Pb(Zr,Ti)O_3$ (hereinafter, referred to as a PZT) is mainly used as a dielectric material for the FeRAM. The material property of the bottom layer disposed under a ferroelectric layer is important to crystallize the ferroelectric layer. That is, in the ferroelectric capacitor, the characteristic of the ferroelectric layer is largely affected by the electrode, so it is necessary to have sufficiently low resistance, a small lattice mismatch between the ferroelectric material and the electrode, a high heat-resistance, a low reactivity, a high diffusion barrier characteristic and a good adhesion between the electrode and the ferroelectric material.

FIG. 2A is a circuit diagram of a conventional FeRAM having adjacent memory cells of which plate lines are separated. Each transistor Tr1, Tr2, in adjacent memory cells CELL0, CELL1, includes a gate electrode respectively connected to a word line WL0, WL1, a source commonly connected to a bit line BL0 and a drain respectively connected to an electrode of a capacitor C1, C2. Each capacitor C1, C2 includes a first electrode connected to cell plate line CP0, CP1, a second electrode connected to the transistor Tr1, Tr2 and a ferroelectric layer formed between the first electrode and the second electrode. The second electrode of the capacitors C1, C2, respectively connected to the transistors Tr1, Tr2, functions as a charge storage electrode. FIG. 2B is a layout of the FeRAM shown in FIG. 2A.

The driving method of a FeRAM differs from a DRAM. In the case of the DRAM, a word line is selected to operate a memory cell when the voltage of a plate line connected to the memory cell is already fixed to a half of the operating potential Vcc. The voltage of a bit line in the DRAM becomes higher or lower than Vcc/2 according to stored data "1" and "0". But, in the case of the FeRAM, the voltage of the cell plate line is varied from "0 V" to the operating potential "Vcc" after a word line is selected.

Also, a sense amplifier of the DRAM compares the voltage of the bit line with the voltage of the bit bar line, of which voltage is fixed to the "Vcc/2", and amplifies the voltage difference between the bit line and bit bar line to detect the stored data, whether the stored data is "1" or "0". But, the voltage of the bit line in the FeRAM is increased regardless of whether the stored data "1" or "0". However, the amount of voltage increase depends on the stored data "1" or "0", such that the voltage increase amount is relatively high when the stored data is "1". Therefore, a reference voltage generator, generating a voltage value between the data "1" and "0", is needed to provide a reference voltage.

The time for driving a cell plate line increases in proportion to the capacitance of the cell plate line. Therefore, a line shaped cell plate is formed to reduce the capacitance and to increase speed. Also, a method is provided to select and to drive a cell plate line whenever a memory cell is selected.

FIG. 3 is a cross-sectional view of the FeRAM shown in FIG. 2A and the layout shown in FIG. 2B.

A semiconductor substrate 10 including an isolation layer 11 and a transistor having a gate insulating layer (not shown), word lines WL0, WL1 and source/drain 12, is provided. A first interlayer insulating layer 13 is formed over the semiconductor substrate 10, and a capacitor, including a bottom electrode 14, a ferroelectric layer 15 and a top electrode 16, is formed. The bottom electrode 14 is connected to cell plate line CP0, CP1 and the top electrode 16 is connected to a storage node. A second interlayer insulating layer 17 is formed on the resulting structure. A first contact hole exposing the top electrode 16 and a second contact hole exposing the source/drain 12 are formed. A metal diffusion barrier layer 18, an interconnection line 19A connecting the top electrode of the capacitor with one of the source/drain 12 and a bit line plug 19B connecting to the other source/drain, are formed. Thereafter, a third interlayer insulating layer 20 and a bit line BL0, connected to the bit line plug 19B, are formed.

Generally the DRAM has a structure referred to as COB, that is, the capacitor of the DRAM is formed over the bit line. By contrast, the FeRAM has a structure referred to as CUB, that is, the capacitor of the FeRAM is formed under the bit line for the convenience of the fabrication process.

The memory cell size of the DRAM is determined by the design rule $8F^2$. The "F" denotes a minimum feature size and generally represents the width of the gate electrode. In the case of FeRAM, it is difficult to meet the design rule, even if the FeRAM has the CUB structure like the DRAM. The memory cell size of the FeRAM is determined by the size of capacitor. Accordingly, the size of the capacitor should be reduced to diminish the memory cell size.

It is possible to reduce the capacitor size without diminishing the size of the charge storage node by forming adjacent memory cells which share the cell plate.

FIG. 4A is a circuit diagram of a conventional FeRAM in which cell plate is shared by the adjacent memory cells. Each transistor Tr1, Tr2, in adjacent memory cells CELL0, CELL2, includes a gate electrode respectively connected to a word line WL0, WL1, a source commonly connected to a bit line BL0 and a drain respectively connected to an electrode of a capacitor C1, C2. Each capacitor C1, C2 includes a first electrode commonly connected to a cell plate CP0_1, a second electrode respectively connected to the transistor Tr1, Tr2 and a ferroelectric layer formed between the first electrode and the second electrode. The first electrodes of the two capacitors C1, C2 are commonly coupled to the cell plate CP0_1, and the second electrodes of the two capacitors C1, C2, which are respectively connected to the transistors Tr1, Tr2, function as charge storage electrodes. FIG. 4B is a layout of the FeRAM shown in FIG. 4A.

FIG. 5 is a cross-sectional view showing the FeRAM according to the circuit diagram shown in FIG. 4A and the layout shown in FIG. 4B.

A semiconductor substrate 10 including an isolation layer 11 and transistors respectively having a gate insulating layer (not shown), a gate electrode connected to the word line WL0, WL1 and source/drain 12, is provided. A first interlayer insulating layer 13 is formed over the semiconductor substrate 10, and a capacitor, including a bottom electrode 14 connected to the cell plate line CP0_1, a ferroelectric layer 15, and a top electrode 16 connected to a storage node. A second interlayer insulating layer 17 is formed on the resulting structure. A first contact hole exposing the top electrode 19 and a second contact hole exposing the source/drain 12 are formed. A metal diffusion barrier layer 18, an interconnection line 19A connecting the top electrode of the capacitor with one of the source/drain 12 and a bit line plug 19B connecting to the other source/drain, are formed. Thereafter, a third interlayer insulating layer 20 and a bit line BL0, connected to the bit line plug 19B are formed.

The cell size of the FeRAM shown in FIGS. 4A, 4B and 5, may be diminished by the reduction in the capacitor size, because a spacing can be omitted owing to the cell plate line being commonly coupled to the two adjacent memory cells.

However, a data disturbance problem is generated due to the fact that the cell plate line is shared by the two adjacent memory cells. That is, if the word line WL0 is selected to operate cells CELL0, CELL1 connected to the word line WL0, and a voltage is applied to the cell plate line CP0_1 shared by two adjacent memory cells CELL0, CELL1, then the voltage is also applied to the capacitor in the memory cells CELL2, CELL3 sharing the cell plate line CP0_1, even though memory cells CELL2, CELL3 are not connected to the word line WL0.

The junction capacitance of the storage node is much smaller than the capacitance of the ferroelectric capacitor. Accordingly, the voltage applied to the ferroelectric capacitor, in the memory cells CELL2, CELL3 connected to the word line WL1, becomes very small because most of the supplying voltage Vcc applied to the cell plate CP0_1 is applied to the storage node junction capacitor, in the memory cell CELL0, CELL1 connected to the word line WL0. However, the charge amount ΔQ1 of the ferroelectric capacitor, in the memory cells CELL2, CELL3 connected to the word line WL1, is reduced, if the memory cells CELL0, CELL1 connected to the word line WL0 are derived repeatedly without driving the memory cells CELL2, CELL3 connected to the word line WL1, as shown in FIG. 6. Consequently, the voltage difference between $V_{BL1}$ and the reference voltage Vref becomes small. In other words, the margin to distinguish the data "1" from the data "0", is reduced to such a point that there exists a high probability for data disturbance.

SUMMARY OF THE INVENTION

It is, therefore, an object of the present invention to provide a FeRAM capable of preventing data disturbance through a cell plate that is shared by the adjacent memory cells.

It is, another object of the present invention to provide a FeRAM driving method capable of preventing the generation of a voltage difference between two electrodes of the capacitor by equalizing the voltage of the storage node in the memory cell, which is not driven, but is sharing the cell plate with the adjacent cell, which is driven.

In accordance with an aspect of the present invention, there is provided a FeRAM device having a first memory cell and a second memory cell sharing a cell plate, wherein the first memory cell and the second memory cell are commonly coupled to a bit line, and wherein the first memory cell is driven by a first word line and the second memory cell is driven by a second word line, the first memory cell comprising a first ferroelectric capacitor having a first electrode connected to the cell plate, a second electrode, and a ferroelectric layer disposed between the first electrode and the second electrode; a first transistor having a first gate electrode connected to the first word line, a first source and a first drain, wherein the first source and the first drain of the first transistor are respectively connected to the bit line and the second electrode of the first ferroelectric capacitor; and a second transistor having a second gate electrode connected to the second word line, a second source and a second drain, wherein the second source and the second drain of the second transistor are respectively connected to the second electrode of the first ferroelectric capacitor and the cell plate. The second memory cell comprises a second ferroelectric capacitor having the first electrode connected to the cell plate, a third electrode, and the ferroelectric layer disposed between the first electrode and the third electrode; a third transistor having a third gate electrode connected to second word line, a third source and a third drain, wherein the third source and the third drain of the third transistor are respectively connected to the bit line and the third electrode of the third ferroelectric capacitor; and a fourth transistor having a fourth gate electrode connected to the first word line, a fourth source and a fourth drain, wherein the fourth source and fourth drain of the fourth transistor are respectively connected to the third electrode of the second ferroelectric capacitor and the cell plate.

In accordance with still another aspect of the present invention, there is provided a FeRAM device having a first memory cell and a second memory cell sharing a cell plate line, wherein the first memory cell and the second memory cell are commonly coupled to a bit line, and wherein the first memory cell is driven by a first word line and the second memory cell is driven by a second word line, the device comprising a first dummy word line diverged from the first word line; and a second dummy word line diverged from the second word line.

In accordance with still another aspect of the present invention, there is provided a FeRAM device, comprising a first ferroelectric capacitor having a first having a first electrode connected to a cell plate, a ferroelectric layer, and a second electrode, a first memory cell and a second memory cell sharing the cell plate, wherein the first memory cell and the second memory cell are commonly coupled to a bit line, and wherein the first memory cell is driven by a first word line and the second memory cell is driven by a second word line; a semiconductor substrate; a first dummy word line diverged from the first word line; a second dummy word line diverged from the second word line; a first transistor having a first gate, a first source and a first drain, wherein the first gate electrode of the first transistor is formed on the semiconductor substrate and connected to the first word line, and wherein the first source and the first drain of the first transistor are respectively connected to the bit line and the second electrode of the first ferroelectric capacitor; a second transistor having a second gate electrode, a second source and a second drain, wherein the second gate electrode of the second transistor is formed on the semiconductor substrate and connected to the second word line, and wherein the second source and the second drain of the second transistor are respectively connected to the second electrode of the first ferroelectric capacitor and the cell plate; a third transistor having a third gate electrode, a third source and a third drain, wherein the third gate electrode is formed on the semiconductor substrate and connected to the second word line; and a fourth transistor having a fourth gate electrode, a fourth source and a fource drain, wherein the fourth gate electrode is connected to the first dummy word line. The FeRAM device further comprising a second ferroelectric capacitor having the first electrode connected to the cell plate, a third electrode, and the ferroelectric layer disposed between the first electrode and the third electrode, wherein the third source and the third drain of the third transistor are respectively connected to the bit line and the third electrode of the second ferroelectric capacitor; and wherein the source and the drain of the fourth transistor are respectively connected to the third electrode of the second ferroelectric capacitor and the cell plate. The ferroelectric capacitor is formed over the second transistor and the fourth transistor, and wherein one side of the first electrode is overlapped with a portion of the second transistor and a second side of the first electrode is overlapped with a portion of the fourth transistor.

In accordance with still another aspect of the present invention, there is provided a method for driving a FeRAM device including a first memory cell and a second memory cell sharing a cell plate line, said first memory cell having a first ferroelectric capacitor and said second memory cell having a second ferroelectric capacitor, of said second ferroelectric capacitor, the first ferroelectric capacitor and the second ferroelectric capacitor each including a first electrode connected to the cell plate, a ferroelectric layer and a second electrode, comprising steps of coupling the first memory cell and the second memory cell to a bit line; driving the first memory cell by a first word line and driving the second memory cell by a second word line; and maintaining an equal voltage of the first electrode of said second ferroelectric capacitor and the second electrode of said second ferroelectric capacitor while the first memory cell is driven.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF THE PREFERRED EMBODIMENTS

Hereinafter, a ferroelectric random access memory (FeRAM) according to the present invention will be described in detail referring to the accompanying drawings.

Figure 1:
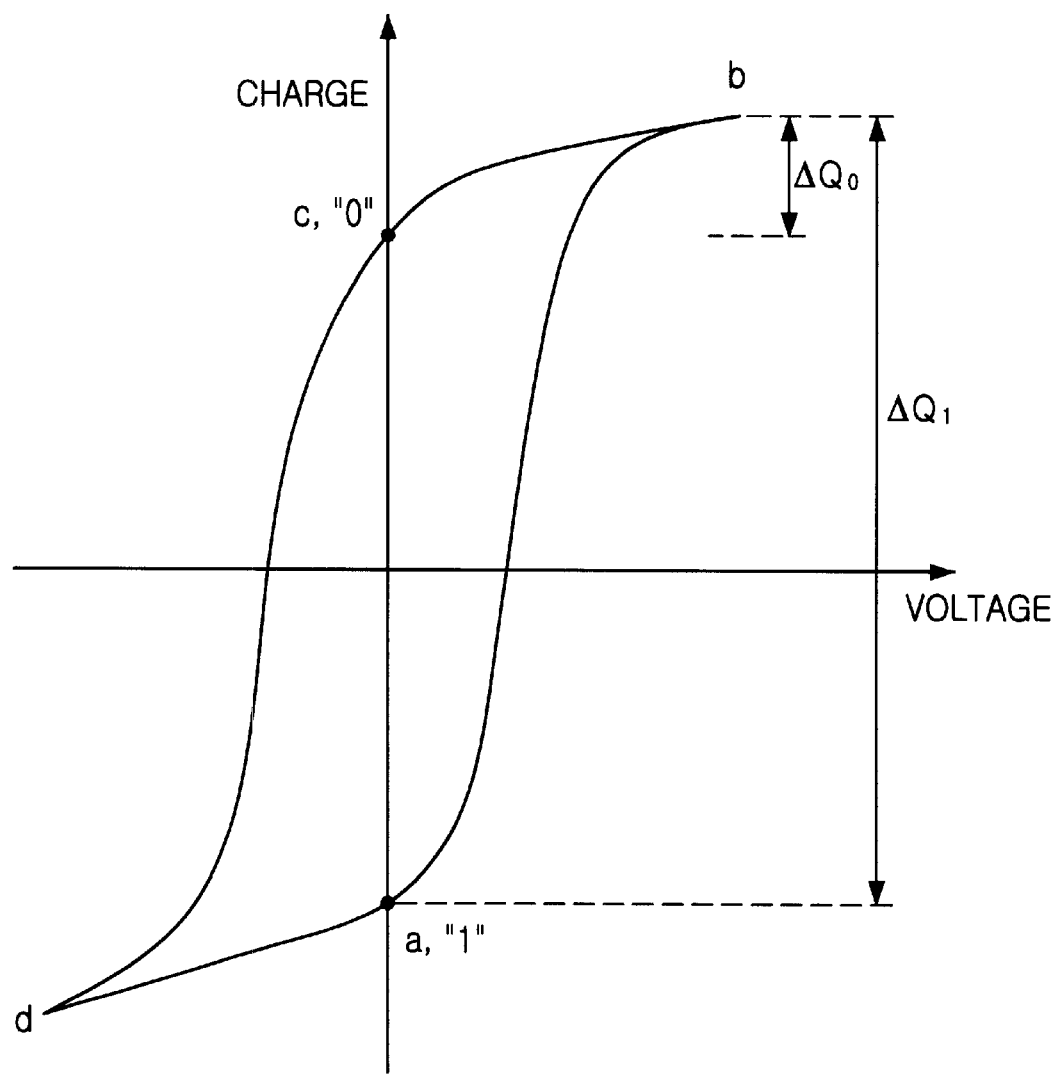
FIG. 1 is a graph showing a hysteresis loop of a conventional ferroelectric capacitor.
Figure 2A:
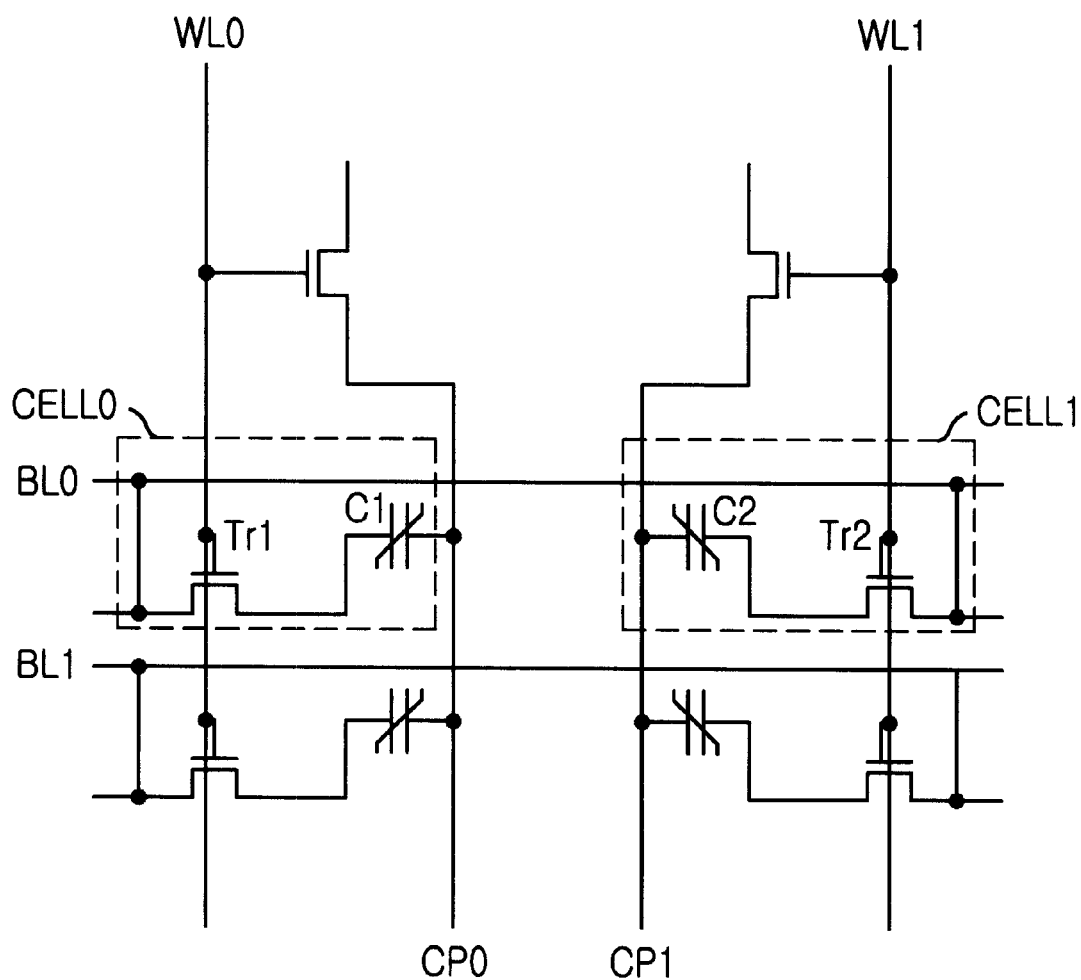
FIG. 2A is a circuit diagram of a conventional FeRAM having adjacent memory cells in which plate lines are separated.
Figure 2B:
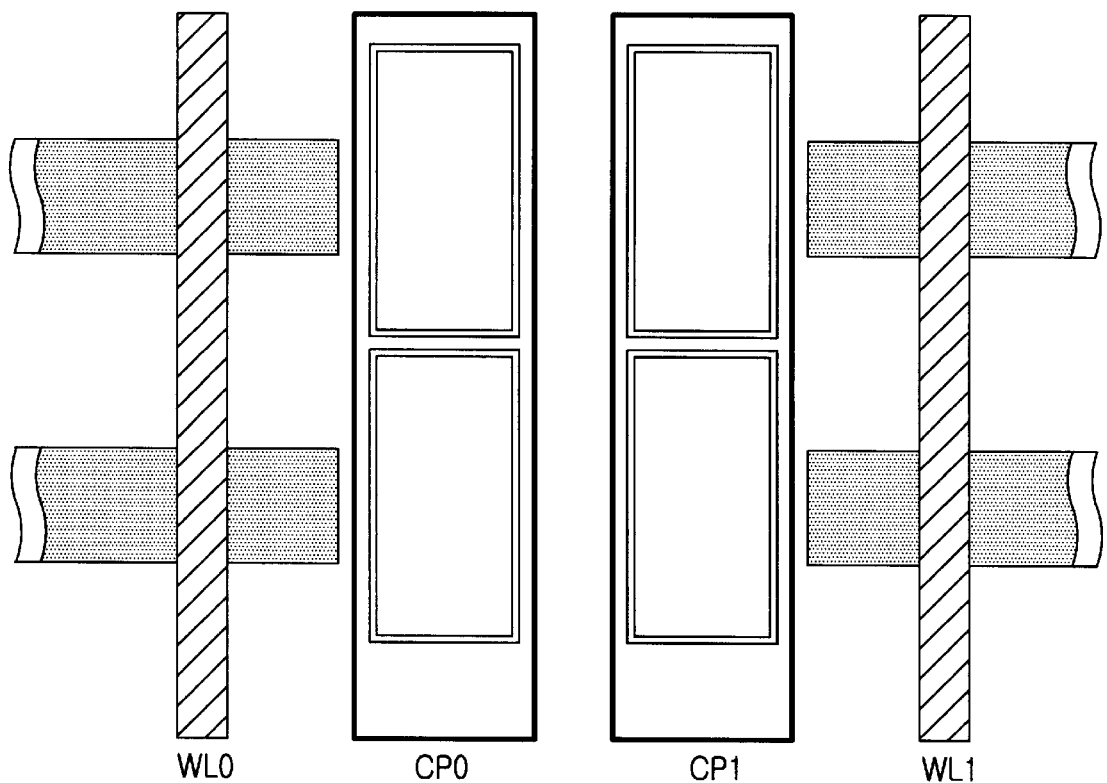
FIG. 2B is the layout of the FeRAM shown in FIG. 2A.
Figure 2B:
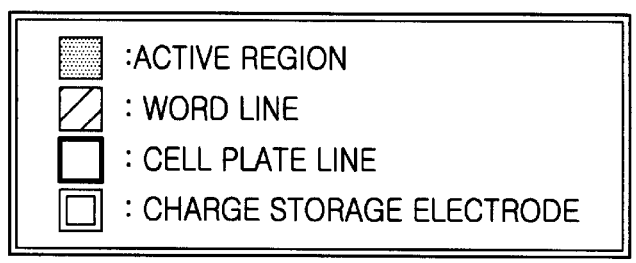
Figure 3:
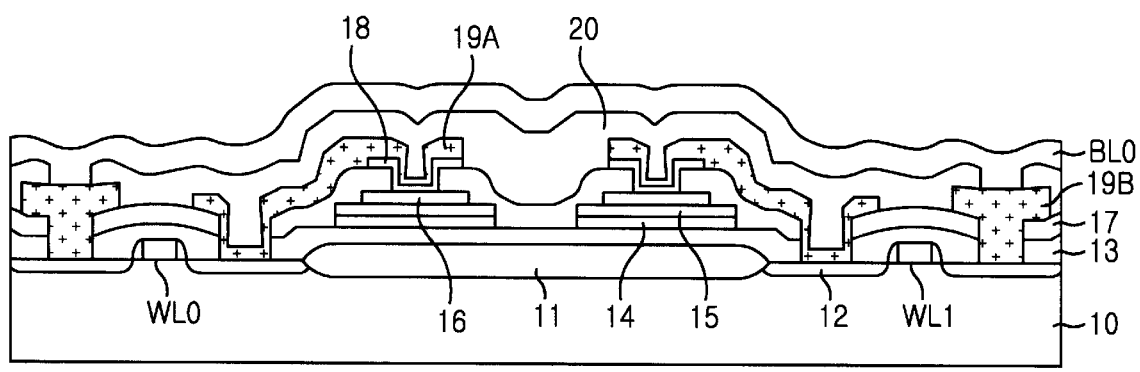
FIG. 3 is the cross-sectional view of the FeRAM shown in FIG. 2A and FIG. 2B.
Figure 4A:
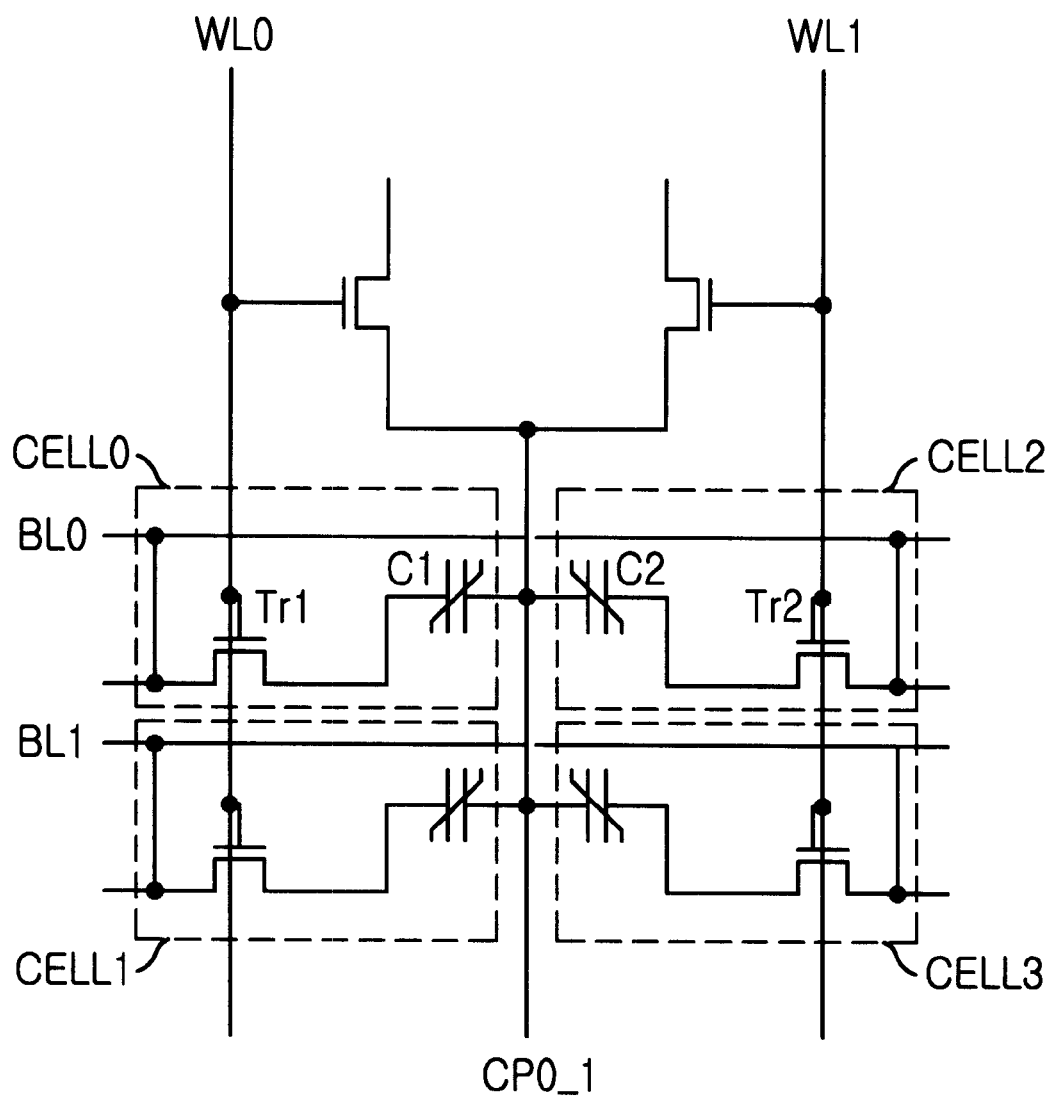
FIG. 4A is a circuit diagram of a conventional FeRAM in which cell plate line is shared by adjacent memory cells.
Figure 4B:
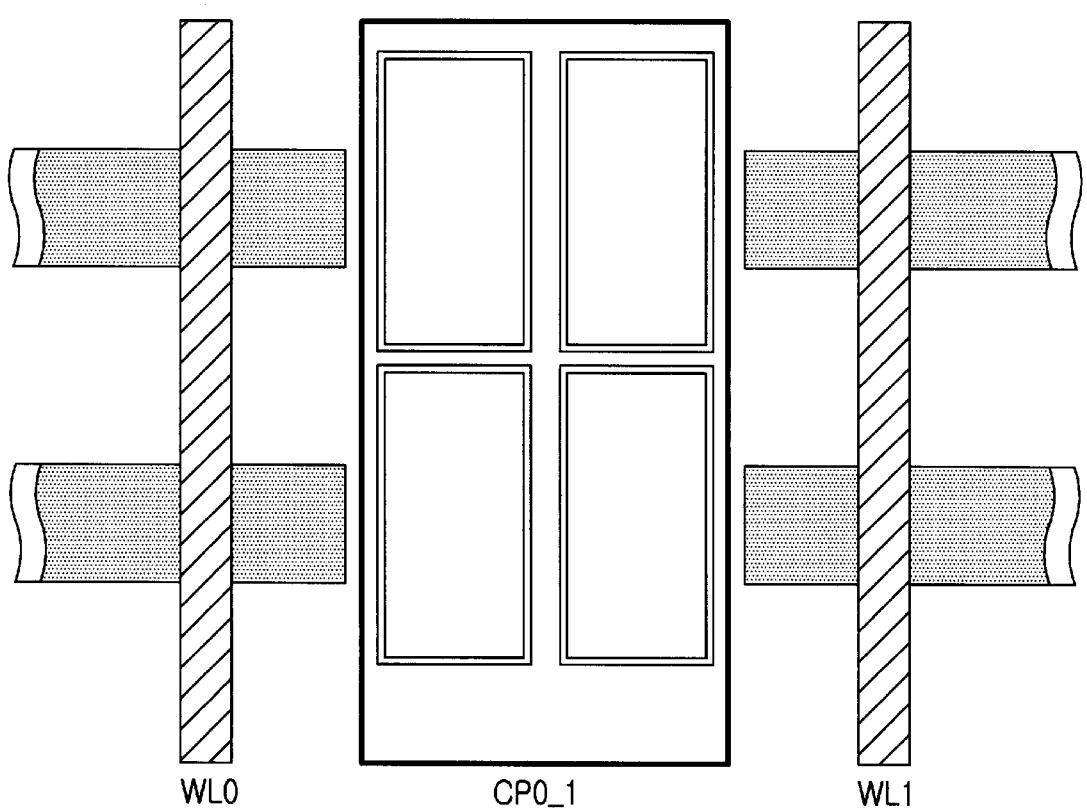
FIG. 4B is the layout of FeRAM shown in FIG. 4A.
Figure 4B:
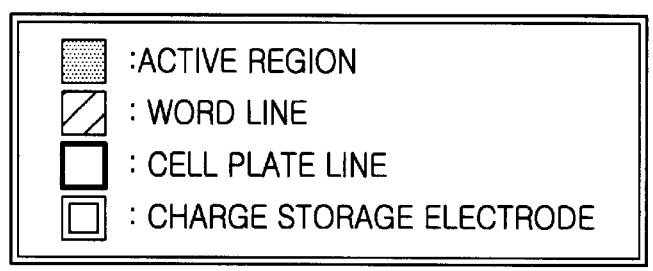
Figure 5:
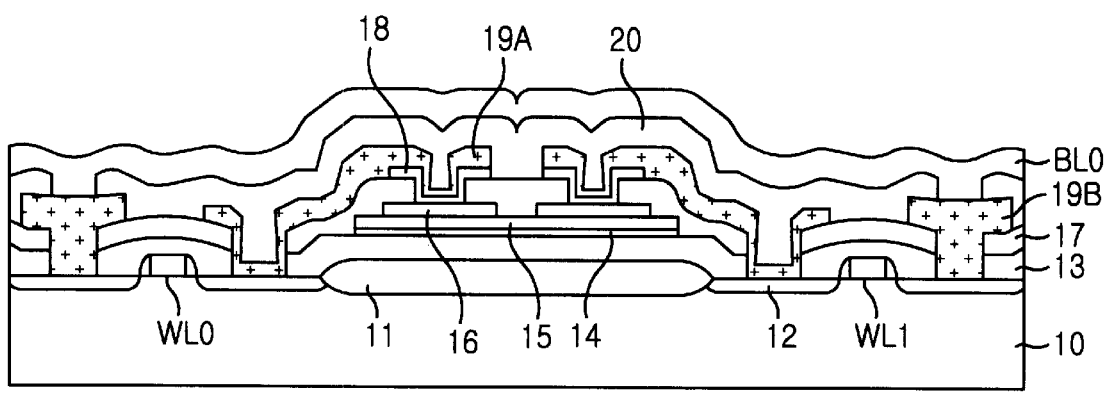
FIG. 5 is the cross-sectional view showing a FeRAM according to the circuit diagram shown in FIG. 4A and the layout shown in FIG. 4B.
Figure 6:
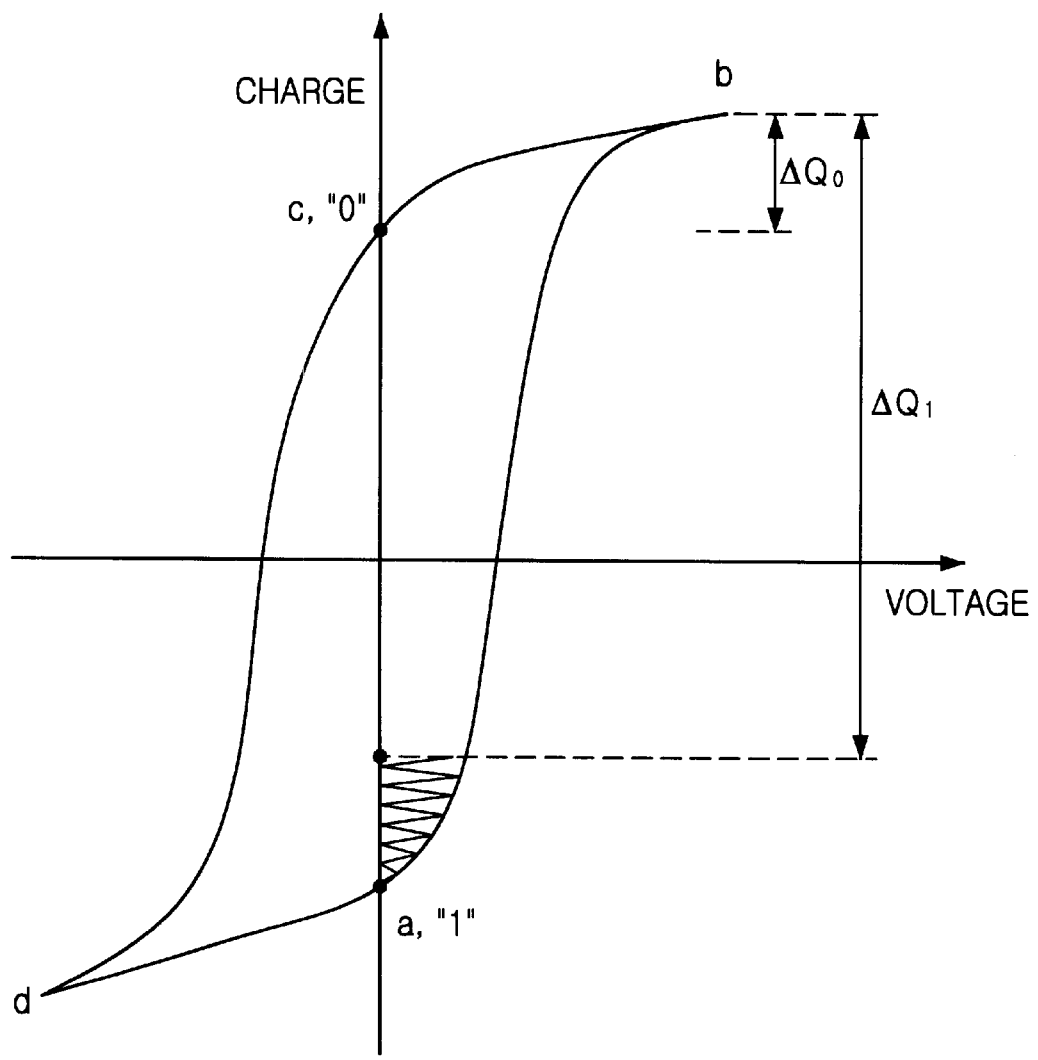
FIG. 6 is a graph showing a hysteresis loop showing the decrease of the charge amount of the ferroelectric capacitor in the cells of the FeRAM in FIGS. 4A and 4B.
Figure 7A:
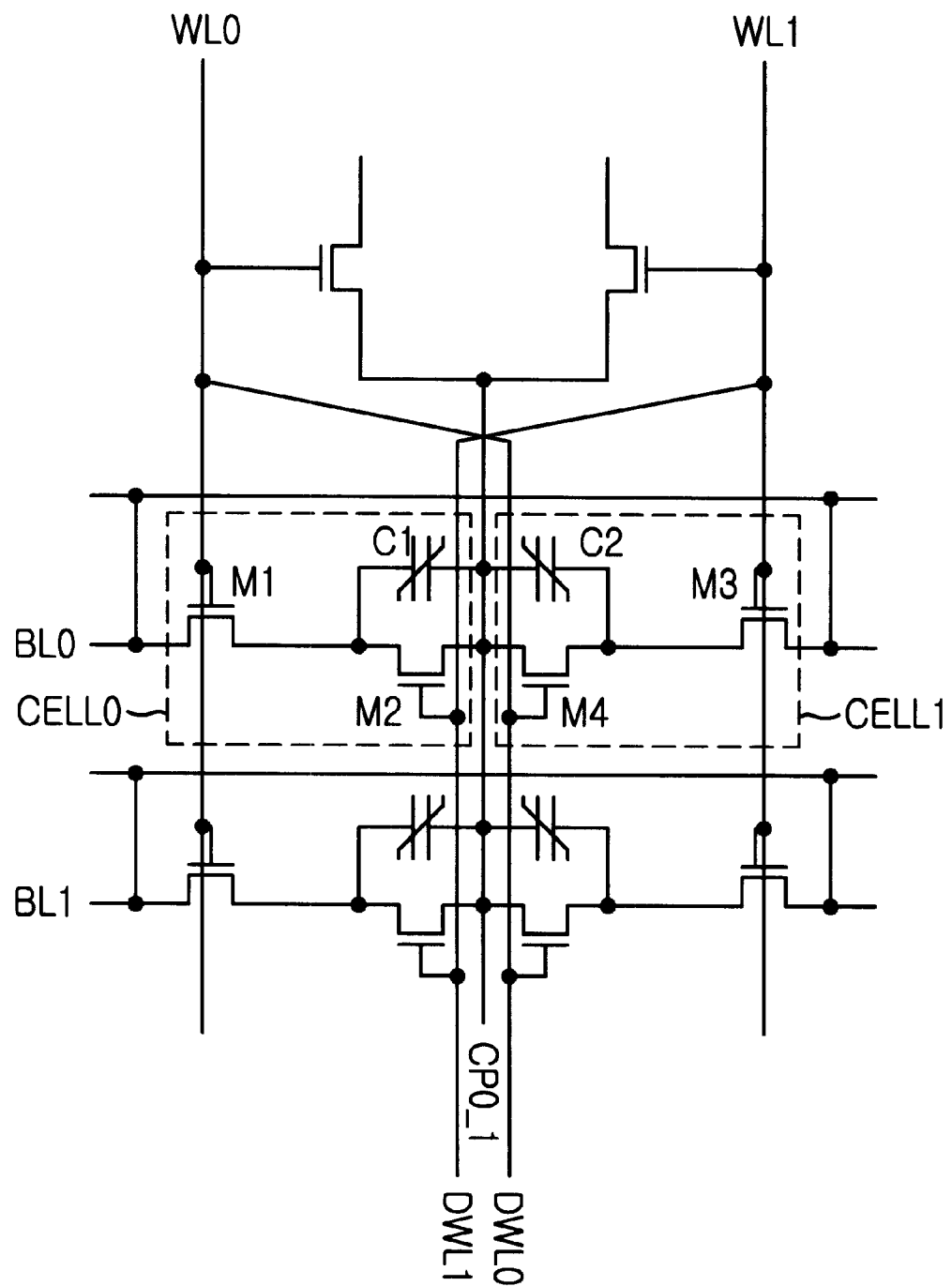
FIG. 7A is a circuit diagram of a FeRAM according to the present invention in which plate lines are shared between adjacent cells.

FIG. 7A is a circuit diagram of a FeRAM according to the present invention in which plate lines are shared by adjacent memory cells. The FeRAM shown in FIG. 7A comprises a first memory cell CELL0 driven by a first word line WL0 and a second memory cell CELL1 driven by a second word line WL1. The first memory cell CELL0 and the second memory cell CELL1 share the cell plate CP0_1 and are commonly coupled to the same bit line BL0. The first memory cell CELL0 further comprises a first dummy word line DWL0 diverged from the first word line WL0 and the second memory cell CELL1 further comprises a second dummy word line DWL1 diverged from the second word line WL1.

The first memory cell CELL0 further comprises a first ferroelectric capacitor C1, a first transistor M1 and a second transistor M2. The first ferroelectric capacitor C1 includes a first electrode connected to the cell plate CP0_1, a ferroelectric layer and a second electrode, which functions as a charge storage electrode. The first transistor M1 includes a gate electrode connected to the first word line WL0, and a source and a drain respectively connected to a bit line BL0 and the second electrode of the first ferroelectric capacitor C1. The second transistor M2 includes a gate electrode connected to the second dummy word line DWL1, and a source and a drain respectively connected to the cell plate CP0_1 and the second electrode of the first ferroelectric capacitor C1.

The second memory cell CELL1 further comprises a second ferroelectric capacitor C2, a third transistor M3 and a fourth transistor M4. The second ferroelectric capacitor C2 includes a first electrode connected to the cell plate line CP0_1, a ferroelectric layer and a second electrode, which functions as a charge storage electrode. The third transistor M3 includes a gate electrode connected to the second word line WL1, and a source and a drain respectively connected to the bit line BL0 and the second electrode of the second ferroelectric capacitor C2. The fourth transistor M4 includes a gate electrode connected to the first dummy word line DWL0, and a source and a drain respectively connected to the cell plate CP0_1 and the second electrode of the second ferroelectric capacitor C2.

Figure 7B:
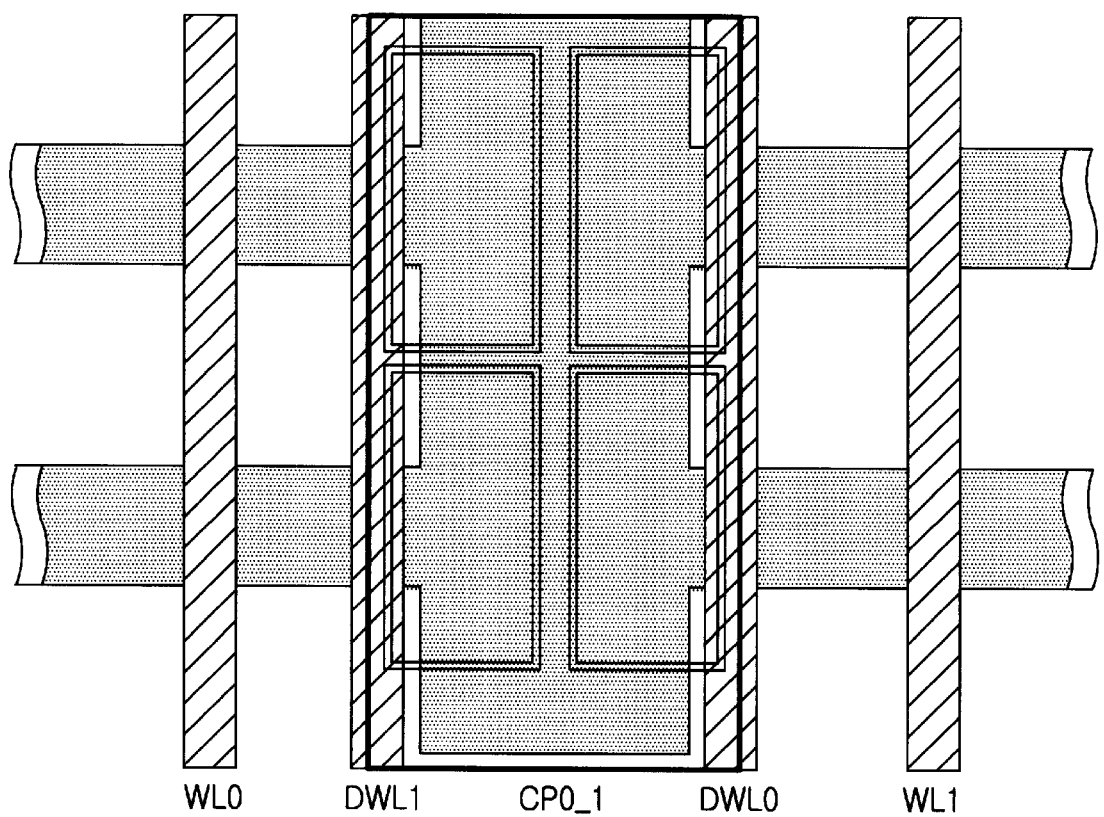
FIG. 7B is the layout of the FeRAM shown in FIG. 7A.
Figure 7B:
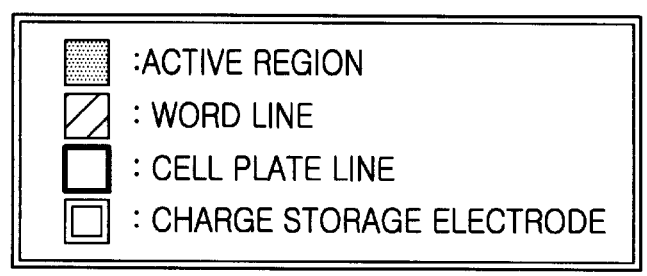

FIG. 7B is the layout showing adjacent word lines and cell plate lines of the FeRAM having the structure shown in FIG. 7A.

If the first memory cell CELL0 coupled to the first word line WL0 is driven, then the first dummy word line DWL0 in the second cell CELL1 coupled to the second word line WL1 is also driven.

In other words, the first electrode and the second electrode, both of the second ferroelectric capacitor, are connected with each other. As a result, a data disturbance is not generated even if the cell plate is shared by adjacent memory cells.

In addition, the second transistor M2 and the fourth transistor M4 are respectively overlapped with the cell plate in order not to increase the cell size.

Figure 8:
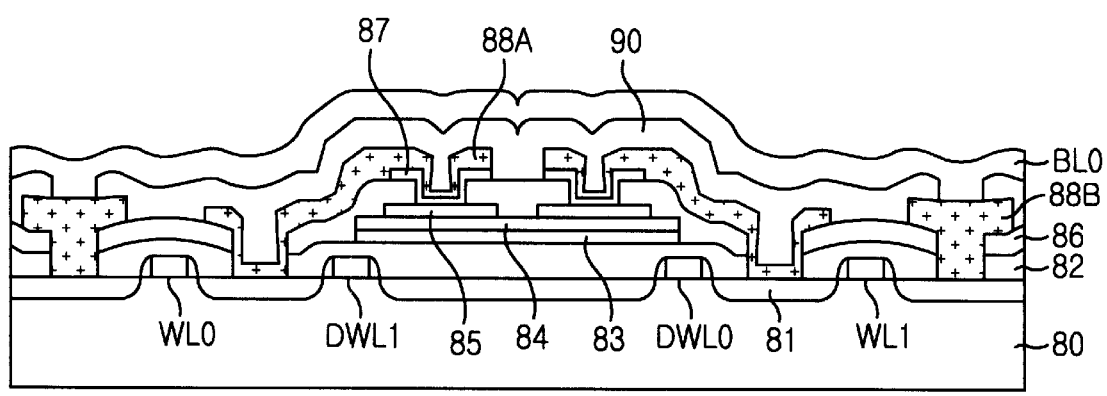
FIG. 8 is a cross-sectional view of the FeRAM shown in FIG. 7A and FIG. 7B.

FIG. 8 is a cross-sectional view of the FeRAM shown in FIG. 7A and the layout shown in FIG. 7B.

A semiconductor substrate 80 including an isolation layer (not shown) and the first, the second, the third and the fourth transistors (M1, M2, M3, M4) is provided. A first interlayer insulating layer 82 is formed over the semiconductor substrate 80, and a capacitor, including a first electrode 83 connected to the cell plate CP0_1, a ferroelectric layer 84 and a second electrode 85 connected to storage node, is formed. A second interlayer insulating layer 86 is formed on the resulting structure. A first contact hole exposing the second electrode 85 and a second contact hole exposing source/drain 81 are formed. A metal diffusion barrier layer 87 contacted to the second electrode 85, an interconnection line 88A connecting the second electrode 85 of the ferroelectric capacitor with the transistor, and a bit line plug 88B are formed. Thereafter, a third interlayer insulating layer 90 and a bit line BL0, connected to the bit line plug 88B, are formed.

As shown in FIG. 8, one side of the first electrode 83 of the ferroelectric capacitor is overlapped with a portion of the gate electrode of the second transistor M2, and the other side of the first electrode 83 is overlapped with a portion of the fourth transistor M4; therefore, the added transistor does not increase the size of the device.

Accordingly, it is possible to prevent any data disturbance without increasing the device size, even though the cell plate is shared by the adjacent memory cells.

While the present invention has been described with respect to the particular embodiments, it will be apparent to those skilled in the art that various changes and modifications may be made without departing from the spirit and scope of the invention as defined in the following claim.

What is claimed is:

1. A FeRAM device having a first memory cell and a second memory cell sharing a cell plate, wherein the first memory cell and the second memory cell are commonly coupled to a bit line, and wherein the first memory cell is driven by a first word line and the second memory cell is driven by a second word line, the first memory cell comprising:
   a first ferroelectric capacitor having a first electrode connected to the cell plate, a second electrode, and a ferroelectric layer disposed between the first electrode and the second electrode;
   a first transistor having a first gate electrode connected to the first word line, a first source and a first drain, wherein the first source and the first drain of the first transistor are respectively connected to the bit line and the second electrode of the first ferroelectric capacitor; and
   a second transistor having a second gate electrode connected to the second word line, a second source and a second drain, wherein the second source and the second drain of the second transistor are respectively connected to the second electrode of the first ferroelectric capacitor and the cell plate.

2. The FeRAM device of claim 1, wherein the second memory cell comprises:
   a second ferroelectric capacitor having the first electrode connected to the cell plate, a third electrode, and the ferroelectric layer disposed between the first electrode and the third electrode;
   a third transistor having a third gate electrode connected to second word line, a third source and a third drain, wherein the third source and the third drain of the third transistor are respectively connected to the bit line and the third electrode of the second ferroelectric capacitor; and
   a fourth transistor having a fourth gate electrode connected to the first word line, a fourth source and a fourth drain, wherein the fourth source and fourth drain of the fourth transistor are respectively connected to the third electrode of the second ferroelectric capacitor and the cell plate.

3. A FeRAM device having a first memory cell and a second memory cell sharing a cell plate line, wherein the first memory cell and the second memory cell are commonly coupled to a bit line, and wherein the first memory cell is driven by a first word line and the second memory cell is driven by a second word line, the device comprising:
   a first dummy word line diverged from the first word line; and
   a second dummy word line diverged from the second word line.

4. The FeRAM device of claim 3, wherein the first memory cell comprises:
   a first ferroelectric capacitor having a first electrode connected to the cell plate, a second electrode, and a ferroelectric layer disposed between the first electrode and the second electrode;

a first transistor having a first gate electrode connected to the first word line, a first source and a first drain, wherein the first source and the first drain of the first transistor are respectively connected to the bit line and the second electrode of the first ferroelectric capacitor; and a second transistor having a second gate electrode connected to the second word line, a second source and a second drain, wherein the second source and the second drain of the second transistor are respectively connected to the second electrode of the first ferroelectric capacitor and the cell plate.

5. The FeRAM device of claim 4, wherein the second memory cell comprises:

a second ferroelectric capacitor having the first electrode connected to the cell plate, a third electrode, and the ferroelectric layer disposed between the first electrode and the third electrode;

a third transistor having a third gate electrode connected to the second dummy word line, a third source and a third drain, wherein the third source and the third drain of the third transistor are respectively connected to the bit line and the third electrode of the third ferroelectric capacitor; and a fourth transistor having a fourth gate electrode connected to the first dummy word line, a fourth source and a fourth drain, wherein the fourth source and fourth drain of the fourth transistor are respectively connected to the third electrode of the second ferroelectric capacitor and the cell plate.

6. A FeRAM device, comprising:

a first ferroelectric capacitor having a first electrode connected to a cell plate, a ferroelectric layer, and a second electrode, a first memory cell and a second memory cell sharing the cell plate, wherein the first memory cell and the second memory cell are commonly coupled to a bit line, and wherein the first memory cell is driven by a first word line and the second memory cell is driven by a second word line;

a semiconductor substrate;

a first dummy word line diverged from the first word line;

a second dummy word line diverged from the second word line;

a first transistor having a first gate, a first source and a first drain, wherein the first gate electrode of the first transistor is formed on the semiconductor substrate and connected to the first word line, and wherein the first source and the first drain of the first transistor are respectively connected to the bit line and the second electrode of the first ferroelectric capacitor;

a second transistor having a second gate electrode, a second source and a second drain, wherein the second gate electrode of the second transistor is formed on the semiconductor substrate and connected to the second word line, and wherein the second source and the second drain of the second transistor are respectively connected to the second electrode of the first ferroelectric capacitor and the cell plate;

a third transistor having a third gate electrode, a third source and a third drain, wherein the third gate electrode is formed on the semiconductor substrate and connected to the second dummy word line; and a fourth transistor having a fourth gate electrode, a fourth source and a fourth drain, wherein the fourth gate electrode is connected to the first dummy word line.

7. The FeRAM device according to claim 6, further comprising:

a second ferroelectric capacitor having the first electrode connected to the cell plate, a third electrode, and the ferroelectric layer disposed between the first electrode and the third electrode, wherein the third source and the third drain of the third transistor are respectively connected to the bit line and the third electrode of the second ferroelectric capacitor; and wherein the source and the drain of the fourth transistor are respectively connected to the third electrode of the second ferroelectric capacitor and the cell plate.

8. The FeRAM device of claim 6, wherein the ferroelectric capacitor is formed over the second transistor and the fourth transistor, and wherein one side of the first electrode is overlapped with a portion of the second transistor and a second side of the first electrode is overlapped with a portion of the fourth transistor.

9. A method for driving a FeRAM device including a first memory cell and a second memory cell sharing a cell plate line, said first memory cell having a first ferroelectric capacitor and said second memory cell having a second ferroelectric capacitor, of said second ferroelectric capacitor, the first ferroelectric capacitor and the second ferroelectric capacitor each including a first electrode connected to the cell plate, a ferroelectric layer and a second electrode, comprising steps of:

coupling the first memory cell and the second memory cell to a bit line;

driving the first memory cell by a first word line and driving the second memory cell by a second word line; and maintaining an equal voltage of the first electrode of said second ferroelectric capacitor and the second electrode of said second ferroelectric capacitor while the first memory cell is driven.

* * * * *